(12) United States Patent
Wang et al.

(10) Patent No.: US 8,750,021 B2
(45) Date of Patent: *Jun. 10, 2014

(54) BIPOLAR RESISTIVE-SWITCHING MEMORY WITH A SINGLE DIODE PER MEMORY CELL

(71) Applicant: Intermolecular, Inc., San Jose, CA (US)

(72) Inventors: Yun Wang, San Jose, CA (US); Tony P. Chiang, Campbell, CA (US); Prashant B. Phatak, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/957,324

(22) Filed: Aug. 1, 2013

(65) Prior Publication Data

US 2013/0314974 A1    Nov. 28, 2013

Related U.S. Application Data

(60) Continuation of application No. 13/720,448, filed on Dec. 19, 2012, now Pat. No. 8,531,868, which is a continuation of application No. 13/286,472, filed on Nov. 1, 2011, now Pat. No. 8,369,131, which is a division of application No. 12/607,898, filed on Oct. 28, 2009, now Pat. No. 8,072,795.

(51) Int. Cl.
| | | |
|---|---|---|
| *G11C 11/36* | (2006.01) | |
| *G11C 7/00* | (2006.01) | |
| *G11C 17/06* | (2006.01) | |
| *G11C 5/02* | (2006.01) | |
| *G11C 13/00* | (2006.01) | |
| *G11C 13/02* | (2006.01) | |
| *G11C 13/04* | (2006.01) | |

(52) U.S. Cl.
CPC ............ *G11C 13/0069* (2013.01); *G11C 13/02* (2013.01); *G11C 13/04* (2013.01); *G11C 2013/0092* (2013.01); *G11C 2213/72* (2013.01)
USPC .......................... 365/148; 365/163; 365/175

(58) Field of Classification Search
CPC .......... G11C 13/0069; G11C 13/0002; G11C 13/0004; G11C 2013/0092; G11C 2213/72; G11C 13/00; G11C 11/00; G11C 7/00
USPC .......................................... 365/148, 163, 175
See application file for complete search history.

(56) References Cited

U.S. PATENT DOCUMENTS

| | | | |
|---|---|---|---|
| 8,072,795 B1 * | 12/2011 | Wang et al. | 365/148 |
| 8,531,868 B2 * | 9/2013 | Wang et al. | 365/148 |
| 2009/0257266 A1 * | 10/2009 | Chen et al. | 365/148 |
| 2010/0182827 A1 * | 7/2010 | Kostylev et al. | 365/163 |
| 2012/0088328 A1 * | 4/2012 | Phatak et al. | 438/104 |
| 2012/0122291 A1 * | 5/2012 | Malhotra et al. | 438/382 |

* cited by examiner

*Primary Examiner* — Ly D Pham

(57) ABSTRACT

According to various embodiments, a resistive-switching memory element and memory element array that uses a bipolar switching includes a select element comprising only a single diode that is not a Zener diode. The resistive-switching memory elements described herein can switch even when a switching voltage less than the breakdown voltage of the diode is applied in the reverse-bias direction of the diode. The memory elements are able to switch during the very brief period when a transient pulse voltage is visible to the memory element, and therefore can use a single diode per memory cell.

20 Claims, 6 Drawing Sheets

BIPOLAR RESISTIVE-SWITCHING MEMORY WITH A SINGLE DIODE PER MEMORY CELL

CROSS-REFERENCE TO RELATED APPLICATIONS

This application is a continuation of U.S. application Ser. No. 13/720,448 filed on Dec. 19, 2012, which is a continuation of U.S. application Ser. No. 13/286,472 filed on Nov. 1, 2011 and issued as U.S. Pat. No. 8,369,131, which is a divisional of U.S. application Ser. No. 12/607,898 filed on Oct. 28, 2009 and issued as U.S. Pat. No. 8,072,795, each of which is incorporated herein by reference for all purposes.

FIELD OF THE INVENTION

The present invention relates generally to semiconductor memories. More specifically, a bipolar resistive-switching memory with a single diode per memory cell is described.

BACKGROUND OF THE INVENTION

Non-volatile memories are semiconductor memories that retain their contents when unpowered. Non-volatile memories are used for storage in electronic devices such as digital cameras, cellular telephones, and music players, as well as in general computer systems, embedded systems and other electronic devices that require persistent storage. Non-volatile semiconductor memories can take the form of removable and portable memory cards or other memory modules, can be integrated into other types of circuits or devices, or can take any other desired form. Non-volatile semiconductor memories are becoming more prevalent because of their advantages of having small size and persistence, having no moving parts, and requiring little power to operate.

Flash memory is a common type of non-volatile memory used in a variety of devices. Flash memory uses an architecture that can result in long access, erase, and write times. The operational speeds of electronic devices and storage demands of users are rapidly increasing. Flash memory is proving, in many instances, to be inadequate for non-volatile memory needs. Additionally, volatile memories (such as random access memory (RAM)) can potentially be replaced by non-volatile memories if the speeds of non-volatile memories are increased to meet the requirements for RAM and other applications currently using volatile memories.

Resistive-switching memories are memories that include a resistive-switching material (e.g. a metal oxide) that changes from a first resistivity to a second resistivity upon the application of a set voltage, and from the second resistivity back to the first resistivity upon the application of a reset voltage. Bipolar resistive-switching memories use set and reset voltages that have opposite polarities relative to a common electrical reference (e.g. a ground). When resistive-switching memory elements are incorporated into a memory array, a select element such as a diode is included to facilitate the selection a desired memory bit. With existing bipolar resistive-switching memories, two or three diodes are required for selection.

Thus, what is needed is a resistive-switching memory array including a simpler select element.

BRIEF DESCRIPTION OF THE DRAWINGS

Various embodiments of the invention are disclosed in the following detailed description and the accompanying drawings.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

According to various embodiments, a resistive-switching memory element and memory element array that uses a bipolar switching includes a select element comprising only a single diode that is not a Zener diode. The transient-type switching characteristics of the resistive-switching memory elements described herein can switch when a switching voltage less than the breakdown voltage of the diode is applied in the reverse-bias direction of the diode. The memory elements are able to switch using a transient-type switching mechanism with a relatively short (e.g. less than 1 ms, less than 10 µs, less than 5 µs, less than 1 µs, or less than 100 ns) voltage pulse (i.e. "a transient pulse voltage") used to switch the memory elements. The memory elements switch during the brief period when the transient pulse voltage is visible to the memory element because the characteristics of the memory element and the materials used to make the memory element allow the resistance to change in the time before a diode used to select the memory element is able to block the current of the pulse.

I. Memory Structure

A. Memory Array

Figure 1:
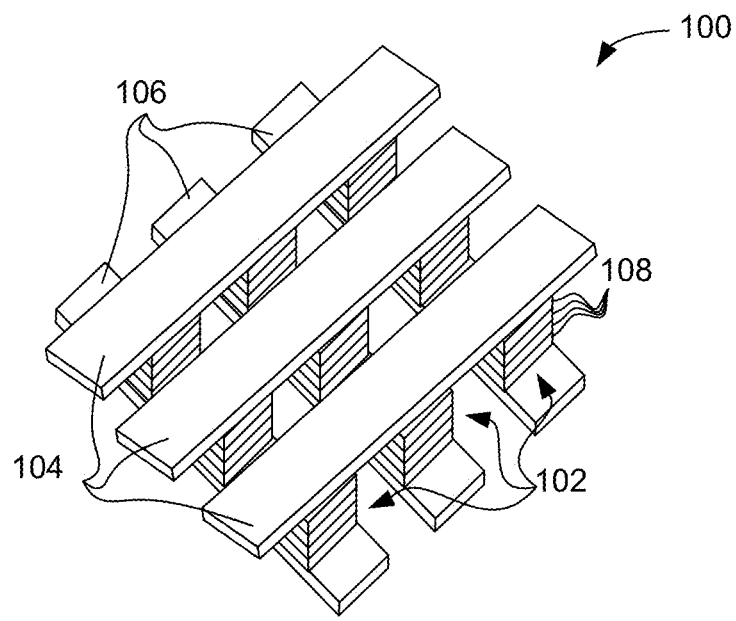
FIG. 1 illustrates a memory array of resistive switching memory elements.

FIG. 1 illustrates a memory array 100 of resistive switching memory elements 102. Memory array 100 may be part of a memory device or other integrated circuit. Memory array 100 is an example of potential memory configurations; it is understood that several other configurations are possible.

Read and write circuitry may be connected to memory elements 102 using signal lines 104 and orthogonal signal lines 106. Signal lines such as signal lines 104 and signal lines 106 are sometimes referred to as word lines and bit lines and are used to read and write data into the elements 102 of array 100. Individual memory elements 102 or groups of memory elements 102 can be addressed using appropriate sets of signal lines 104 and 106. Memory element 102 may be formed from one or more layers 108 of materials, as is described in further detail below. In addition, the memory arrays shown can be stacked in a vertical fashion to make multi-layer three-dimensional (3-D) memory arrays.

Any suitable read and write circuitry and array layout scheme may be used to construct a non-volatile memory device from resistive switching memory elements such as element 102. For example, horizontal and vertical lines 104 and 106 may be connected directly to the terminals of resistive switching memory elements 102. This is merely illustrative.

Figure 2:
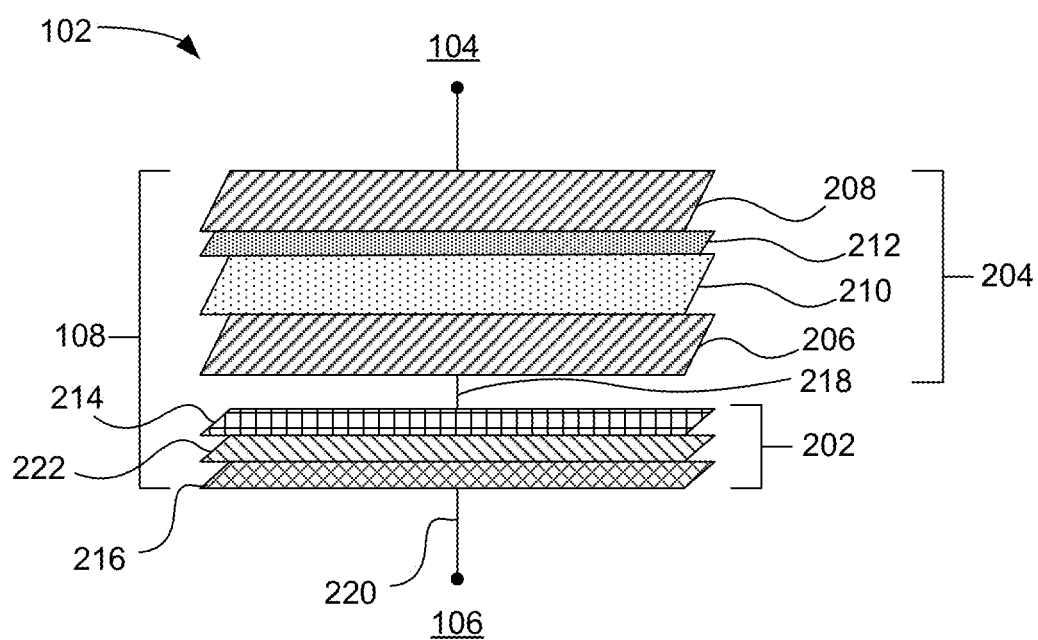
FIG. 2 illustrates a memory element including a resistive-switching material and a select element (a diode)

Other electrical devices are associated (i.e., may be one or more of the layers 108) with each memory element 102 (see, e.g., FIG. 2). These devices, which are sometimes referred to as select elements, may include, for example, diodes, p-i-n diodes, silicon diodes, silicon p-i-n diodes, Schottky diodes, transistors, etc. Select elements may be connected in series in any suitable locations in memory element 102. As is described herein, a diode is associated with each memory element 102.

B. Memory Element

1. MIM Structure

FIG. 2 illustrates a memory element 102 including a resistive-switching material and a select element (a diode 202). The memory element 102 includes a metal-insulator-metal (MIM)-style stack 204. The stack 204 includes two electrodes: a first electrode 206 and a second electrode 208 and a resistive-switching layer 210 (e.g. an insulator or metal oxide). The electrodes 206 and 208 can be metals, metal oxides, or metal nitrides (e.g. Pt, Ru, RuO$_2$, Ir, IrO$_2$, TiN, W, Ta, TaN), or can be doped silicon, for example p- or n-type doped polysilicon. The resistive-switching layer 210 can be a metal oxide or other switching material. In some embodiments, the resistive-switching layer 210 is a higher bandgap (i.e. bandgap greater than four electron volts (eVs)) material such as HfO$_2$, Ta$_2$O$_5$, or Al$_2$O$_3$, Y$_2$O$_3$, or ZrO$_2$ (see FIGS. 5 and 6).

Figure 5:
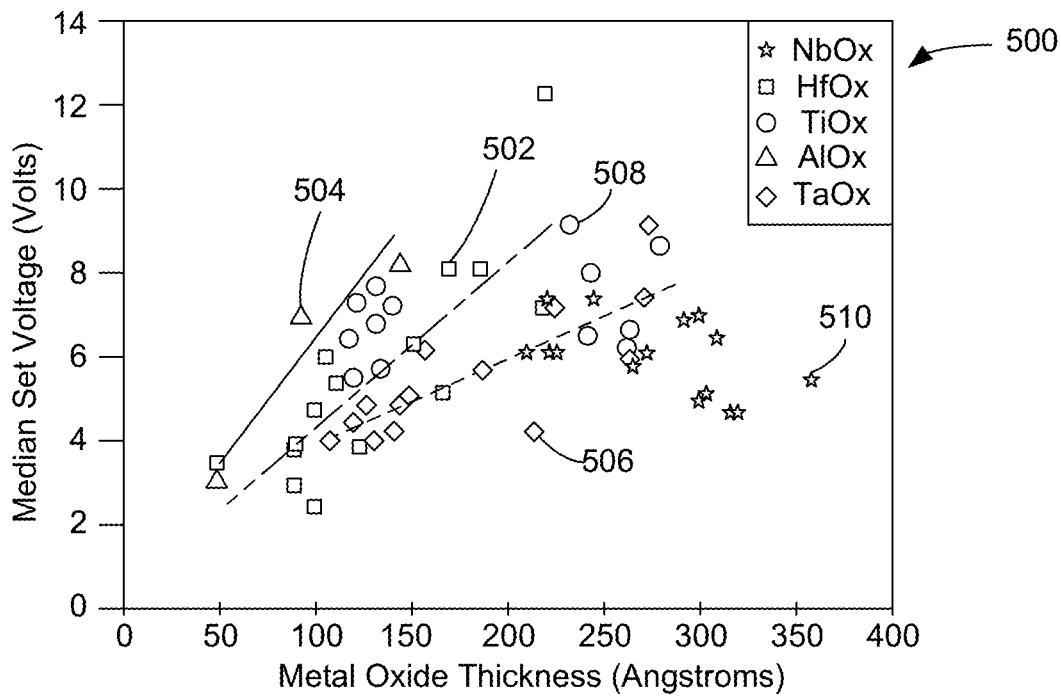
FIGS. 5 and 6 are graphs showing the relationship between thicknesses of a metal oxide layer and resulting set voltages, reset voltages, and on/off current ratios for several materials systems used in memory elements described herein.
Figure 6:
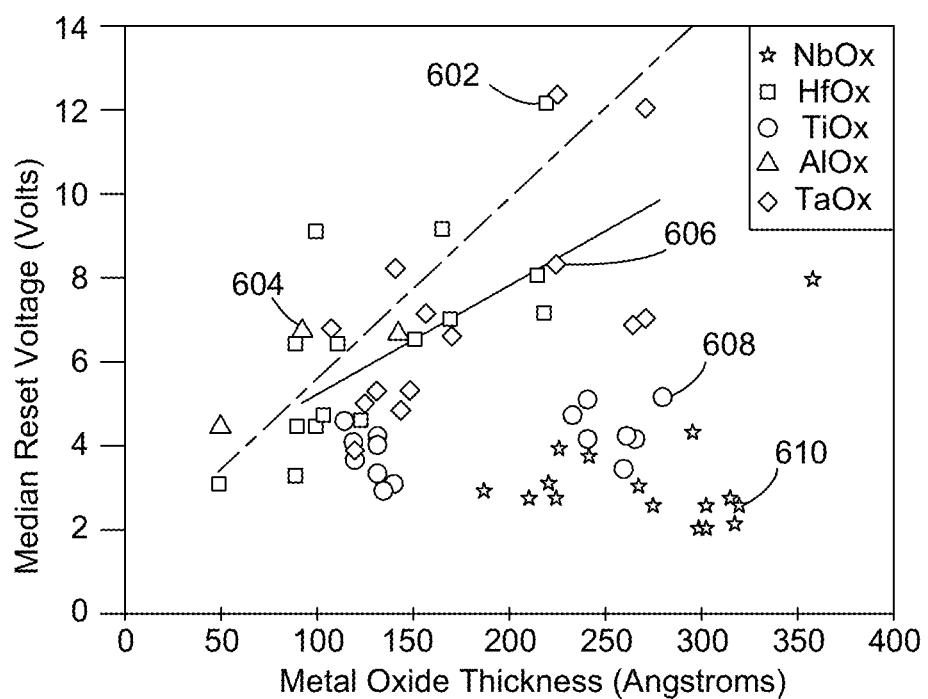

Higher bandgap materials (e.g. those with a bandgap greater than 4 electron volts (eV), as is shown in FIGS. 5 and 6, in some configurations may have voltage-dependent (field-based) switching characteristics. As is explained further below, these materials use defect-based mechanisms to switch from a high resistance state to a low resistance state and vice versa. These materials further have set and reset voltages (i.e. switching voltages) that increase with increasing thickness of the resistive-switching layer 210, which demonstrates that the defects are filled by a voltage-mediated (e.g. a field-based) mechanism, and that the defects can be filled (and the resistance of the layer can change) during a transient voltage pulse that is briefly present before a diode blocks current in the reverse bias direction.

The stack 204 can also include an interface layer 212, which may be another metal oxide such as TiO$_2$, ZrO$_2$, and Al$_2$O$_3$. The interface layer 212 can, for example, provide a diffusion barrier between the second electrode 208 and the resistive-switching layer 210, and the interface layer 212 can optionally include a same most prevalent metal as the second electrode 208 (e.g. the electrode can be TiN, while the interface layer 212 is TiO$_2$). The interface layer 212 can be thinner than the resistive-switching layer 210, for example the interface layer 212 can have a thickness that is less than 25% of the thickness of the resistive-switching layer 210, or a thickness that is less than 10% of the thickness of the resistive-switching layer 210. For example, the resistive-switching layer 210 can be a 50 Å layer, or a 20-100 Å or 20-60 Å layer, and the interface layer 212 can be a 5-10 Å layer.

Additionally, the electrodes 206 and 208 can be different materials. In some embodiments, the electrodes 206 and 208 have a work function that differs by between 0.1 and 1 electron volt (eV), or by between 0.4 and 0.6 eV. For example, the second electrode 208 can be TiN, which has a work function of approximately 4.5-4.6 eV, while the first electrode 206 can be n-type polysilicon, which has a work function of approximately 4.1-4.15 eV. Other electrode materials include p-type polysilicon (4.9-4.95 eV), tantalum nitride (4.7-4.8 eV), molybdenum oxide (approximately 5.1 eV), molybdenum nitride (4.0-5.0 eV), tungsten (approximately 4.5 eV), ruthenium (approximately 4.7 eV), and ruthenium oxide (approximately 5.0 eV). For some embodiments described herein (e.g. with a titanium nitride first electrode 206 and a noble or near-noble such as platinum/ruthenium/ruthenium oxide, etc. second electrode 208), the higher work function electrode receives a positive pulse (as measured compared to a common potential) during a reset operation (see e.g. FIG. 11). For other embodiments (e.g. when using non-noble electrode such as a polysilicon first electrode 206 and a titanium nitride second electrode 208), the higher work function electrode receives a negative pulse during a reset operation (see e.g. FIG. 12).

The diode 202 may include two or more layers of semiconductor material. The diode 202 is configured within the memory array 100 such that there is one diode for each memory element 102. In other words, there is only one diode 202 directly connected to and used to select each memory element 102. A diode is generally a p-n junction, and doped silicon layers 214 and 216 can form the p-n junction. For example, doped silicon layer 214 can be a p-type layer and doped silicon layer 216 can be an n-type layer, so that a node 218 of the diode 202 is an anode and is connected to the first electrode 206. In this example, a node 220 of the diode 202 is a cathode and is connected to the signal line 106, which may be, for example, a bit line or word line, or connected to a bit line or word line. The nodes 218 and 220 are not necessarily present in the memory array 100, for example the first electrode 206 may be in direct contact with the doped silicon layer 214 or another physical layer in between the first electrode 206 and the doped silicon layer 214. In other embodiments, doped silicon layer 214 is an n-type layer and doped silicon layer 216 is a p-type layer, and the node 218 is a cathode of the diode 202 and the node 220 is an anode of the diode 202. In some embodiments, the reset voltage has a higher magnitude (e.g. $V_{RESET}=-4V$ at the second electrode 208 and $V_{SET}=+2V$ at the second electrode 208). Therefore, it may be desirable to forward-bias the diode 202 in the direction of the reset pulse (e.g. see FIGS. 11 and 12). An optional insulating layer 222 can be placed between the doped silicon layers 214 and 216 to create a p-i-n or n-i-p diode 202.

In some embodiments, a memory cell can include a diode 202 and an MIM stack 204. The MIM stack 204 can be a resistive-switching memory element that includes the first electrode 206, a resistive-switching layer (e.g. the resistive-switching layer 210) above the first electrode, and the second electrode 208. An anode (e.g. the node 218) or a cathode of the diode 202 is connected to the first electrode 206, and the first electrode may be electrically connected only to the diode 202 and the resistive-switching layer 210. There is a single diode per memory cell, such that each MIM stack 204 is associated with a select element comprising a single diode (e.g. the diode 202) that is not a Zener diode.

In some embodiments, a signal line (e.g. the signal line 104) is connected to the second electrode 208, and the signal line is configured to provide switching voltages to the second electrode. In some embodiments, the signal line is configured to provide a negative set voltage relative to a common electrical reference, and a positive reset voltage relative to the common electrical reference (see e.g. FIG. 11). In other embodiments, the signal line is configured to provide a positive set voltage relative to a common electrical reference and a negative reset voltage relative to the common electrical reference (see e.g. FIG. 12). For example, the common electrical reference may be ground (i.e. 0V), the set voltage would then be a negative voltage (e.g. −2V), and the reset voltage would be a positive voltage (e.g. 2V). The common electrical reference can be any voltage, however, such as +2V or −2V. More generally, one switching voltage (e.g. the reset voltage) of the memory element can have a first polarity (e.g. a positive polarity) relative to the common electrical reference, and the other switching voltage (e.g. the set voltage) can have a negative polarity relative to the common electrical reference so that the memory element uses bipolar switching. The diode 202 has a breakdown voltage $V_{BREAKDOWN}$ in its reverse bias direction (e.g. from node 220 to node 218), which has a magnitude that is greater than the magnitude of the set voltage. For example, $V_{BREAKDOWN}$ typically has a high magnitude, e.g. −10V. Additionally, the switching voltages such as the set voltage comprise a transient pulse voltage (e.g. a square wave pulse) having a pulse length of less than 10 μs. In some embodiments, the signal line 104 is a bit line, while the signal line 106, which is connected to a either a cathode or an anode of the diode 202, is a word line.

Additionally, in further embodiments, it may be desirable to have a low-leakage material as the resistive-switching layer 210 in order to aid memory retention. For example, the layer 210 may be a material that has a leakage current density less than 40 amps per square centimeter (A/cm$^2$) measured at 0.5 volts (V) per twenty angstroms of the thickness of the metal oxide in an off state (e.g. a high resistance state) of the memory element.

2. Material Examples

Some examples of stacks 204 that can be used include a stack 204 having a titanium nitride first electrode 206, a 20-60 Å hafnium oxide resistive-switching layer 210, a 5-10 Å titanium oxide interface layer 212, and an electrode with a work function greater than that of TiN, such as Ru, RuO$_2$, Molybdenum oxides, Ir, IrO$_2$, Pt, other noble or near-noble materials, etc. second electrode 208. In this example, the higher work function electrode receives a positive pulse (as measured compared to a common potential) during a reset operation. Another example of a stack 204 is one including a doped polysilicon first electrode 206, a 20-60 Å hafnium oxide resistive-switching layer 210, a 5-10 Å titanium oxide interface layer 212, and a titanium nitride second electrode 208. In other embodiments, the resistive-switching layer 210 can be another high bandgap material (e.g. Ta$_2$O$_5$, Al$_2$O$_3$, etc.). As described above, in some embodiments the electrodes can be materials exhibiting a work function difference (e.g. 0.1 to 1 eV, or 0.4 to 0.6 eV, etc.)

In some embodiments, the switching layer 210 can be between 20 and 100 Å thick, 20 and 60 Å thick, 10 and 200 Å thick, 40 and 60 Å thick, or any appropriate thickness for a given application. The interface layer 212 can be less than 25 percent the thickness of the switching layer 210. The various layers can be deposited using any deposition technique, including physical vapor deposition (PVD), chemical vapor deposition (CVD), plasma-enhanced CVD (PECVD), atomic layer deposition (ALD), plasma-enhanced ALD (PEALD), electroless deposition (ELD), electroplating, etc. In some embodiments, multiple deposition techniques can be used, for example, the electrodes can be deposited using PVD, while the switching layer 210 and interface layer 212 are deposited using ALD.

II. Memory Operation

During a read operation, the state of a memory element 102 can be sensed by applying a sensing voltage (i.e., a "read" voltage $V_{READ}$) to an appropriate set of signal lines 104 and 106. Depending on its history, a memory element that is addressed in this way may be in either a high resistance state or a low resistance state. The resistance of the memory element therefore determines what digital data is being stored by the memory element. If the memory element has a low resistance, for example, the memory element may be said to contain a logic one (i.e., a "1" bit). If, on the other hand, the memory element has a high resistance, the memory element may be said to contain a logic zero (i.e., a "0" bit). During a write operation, the state of a memory element can be changed by application of suitable write signals to an appropriate set of signal lines 104 and 106.

Figure 3:
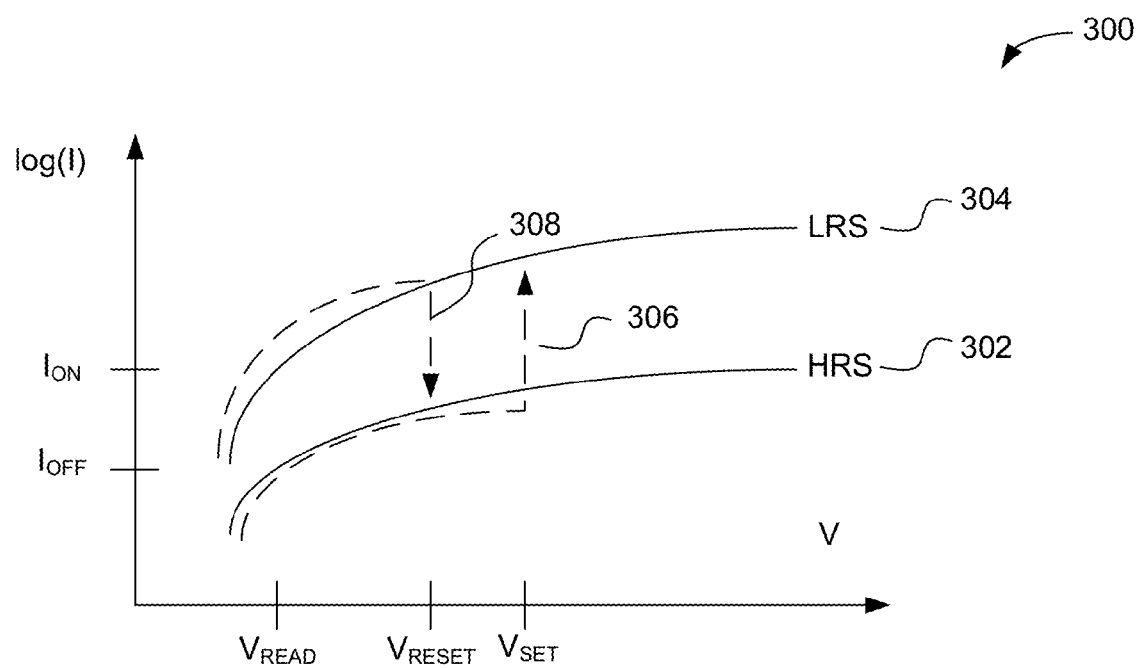
FIG. 3 is a logarithm of current (I) versus voltage (V) plot for a memory element.

FIG. 3 is a logarithm of current (I) versus voltage (V) plot 300 for a memory element 102. FIG. 3 illustrates the set and reset operations to change the contents of the memory element 102. Initially, memory element 102 may be in a high resistance state ("HRS", e.g., storing a logic zero). In this state, the current versus voltage characteristic of memory element 102 is represented by solid line HRS 302. The high resistance state of memory element 102 can be sensed by read and write circuitry using signal lines 104 and 106. For example, read and write circuitry may apply a read voltage $V_{READ}$ to memory element 102 and can sense the resulting "off" current $I_{OFF}$ that flows through memory element 102. When it is desired to store a logic one in memory element 102, memory element 102 can be placed into its low-resistance state. This may be accomplished by using read and write circuitry to apply a set voltage $V_{SET}$ across signal lines 104 and 106. Applying $V_{SET}$ to memory element 102 causes memory element 102 to switch to its low resistance state, as indicated by dashed line 306. In this region, the memory element 102 is changed so that, following removal of the set voltage $V_{SET}$, memory element 102 is characterized by low resistance curve LRS 304. As is described further below, the change in the resistive state of memory element 102 may be because of the filling of traps (i.e., a may be "trap-mediated") in a metal oxide material. $V_{SET}$ and $V_{RESET}$ can be generally referred to as "switching voltages."

The low resistance state of memory element 102 can be sensed using read and write circuitry. When a read voltage $V_{READ}$ is applied to resistive switching memory element 102, read and write circuitry will sense the relatively high "on" current value $I_{ON}$, indicating that memory element 102 is in its low resistance state. When it is desired to store a logic zero in memory element 102, the memory element can once again be placed in its high resistance state by applying a reset voltage $V_{RESET}$ to memory element 102. When read and write circuitry applies $V_{RESET}$ to memory element 102, memory element 102 enters its high resistance state HRS, as indicated by dashed line 308. When the reset voltage $V_{RESET}$ is removed from memory element 102, memory element 102 will once again be characterized by high resistance line HRS 304. Voltage pulses can be used in the programming of the memory element 102. For example, a 1 ms, 10 μs, 500 ns, 50 ns, etc. square pulse can be used to switch the memory element 102; in some embodiments, it may be desirable to adjust the length of the pulse depending on the amount of time needed to switch the memory element 102.

A forming voltage $V_{FORM}$ is a voltage applied to the memory element 102 to ready the memory element 102 for use. Some memory elements described herein may need a forming event that includes the application of a voltage greater than or equal to the set voltage or reset voltage, but less than the breakdown voltage of the diode 202. Once the memory element 102 initially switches, the set and reset voltages can be used to change the resistance state of the memory element 102.

The bistable resistance of resistive switching memory element 102 makes memory element 102 suitable for storing digital data. Because no changes take place in the stored data in the absence of application of the voltages $V_{SET}$ and $V_{RESET}$, memory formed from elements such as element 102 is non-volatile.

Returning to FIG. 2, the diode 202 is not a Zener diode, but rather could be a standard p-n junction diode. Zener diodes allow reverse breakdown, but may be difficult to use in the voltage ranges needed for ReRAM applications. For example, it is generally desirable to use lower magnitude switching voltages, and a set voltage of, for example, −2V may be typical. Zener diodes may be difficult to fabricate in these lower voltage ranges, and may also need to be operable in a wider voltage range because of the distribution of some switching pulses, some of which may have a lower magnitude (e.g. −1.5V) than the median value. Zener diodes typically cannot be made to accommodate such requirements.

The diode 202 has a forward bias direction (for example, from the node 218 to the node 220), and a reverse bias direction (for example, from the node 220 to the node 218). The breakdown voltage $V_{BREAKDOWN}$ of the diode 202 is the voltage at which current will flow in the reverse bias direction of the diode 202. Using a standard diode, application of $V_{BREAKDOWN}$ may permanently damage the diode 202.

The memory element 102 uses bipolar switching voltages. In other words, at the second electrode 208, one switching voltage (e.g. $V_{RESET}$) is positive compared to a common electrical reference (e.g. a ground), while the other switching voltage (e.g. $V_{SET}$) is negative compared to the common electrical reference. As an example, the common electrical reference may be ground (0V), while $V_{RESET}$ is +2V, and $V_{SET}$ is −2V. A diode is a device that allows current to flow in one direction but not the other. So using this example, if the diode 202 is forward biased in the direction from the node 218 to the node 220, when the positive $V_{RESET}$ is applied to the second electrode 208, current will flow through the diode 202. However, when the negative $V_{SET}$ is applied to the second electrode 208, the diode 202 will prevent current from flowing. But when the negative $V_{SET}$ is initially applied to the second electrode 208, the memory element 102 (including the resistive-switching layer 210) will very briefly see a transient pulse voltage before the diode 202 blocks the current. This transient pulse voltage, because of the switching characteristics of the resistive-switching layer 210, is sufficient to cause the traps to fill (or empty) in the resistive-switching layer 210, thereby causing the memory element 102 to switch. The switching voltage that causes current to flow in the reverse bias direction of the diode 202 (in this example, $V_{SET}$), has a magnitude that is less (potentially much less) than $V_{BREAKDOWN}$.

In some embodiments, $V_{RESET}$ has a higher magnitude that $V_{SET}$. Therefore, it may be desirable to have the diode 202 configured so that it is forward biased in the direction of $V_{RESET}$ (see FIGS. 11 and 12).

III. Switching

Without being bound by theory, the memory element 102 uses a switching mechanism that is mediated in the bulk of a layer of the metal oxide. In one embodiment, the switching mechanism uses non-metallic conductive paths rather than filamentary or metallic conductive paths. Generally, defects are formed in, already exist in the deposited metal oxide, and existing defects can be enhanced by additional processes. Defects may take the form of variances in charge in the structure of the metal oxide. For example, some charge carriers may be absent from the structure (i.e., vacancies), additional charge carriers may be present (i.e., interstitials), or one species may substitute for another (e.g. Ti into Hf, a substitutional). Therefore, by applying a voltage to the memory element 102, the defects, such as traps, can either be filled or emptied to alter the resistivity of a metal oxide and resistive switching memory elements can be formed using these principles.

It is believed that the memory elements described herein are governed by a transient-type switching mechanism that switches using a short transient voltage pulse (e.g. less than 1 ms, less than 10 μs, less than 500 ns, less than 50 ns, etc.). This mechanism may use a voltage-dependent (see below), current-dependent, power-dependent mechanism, or some combination of these mechanisms. However, because the memory element is able to switch with the application of a short pulse, a single, standard diode can be used as a select element even using bipolar switching voltages. For example, using bipolar switching voltages, one switching voltage (e.g. the set voltage) will use a current that flows in the reverse-bias direction of the diode. Because the memory element is able to switch so quickly using the transient voltage pulse, the memory element sees the transient voltage pulse and is able to switch before the diode is able to block the current. As a result, a single diode that is not a Zener diode can be used as a select element with the memory elements described herein.

It can be shown that the set voltage is dependent on the thickness of the metal oxide layer (see discussion regarding FIGS. 5 and 6) which may indicate a bulk-mediated mechanism and voltage-dependent (e.g. electric field-based) switching characteristics. As is discussed above, the memory element 102 may be one that has voltage-dependent (e.g. electric field-based) switching characteristics, which indicates that the application of switching voltages fills and empties the traps of the resistive-switching layer 210, allowing the memory element 102 to switch. However, in other embodiments, the memory element 102 may exhibit current-dependent switching characteristics, power-dependent switching characteristics, or some combination. The memory elements 102 are configured to use a transient pulse that is able to switch the memory element 102 even when a current is passed in the reverse bias direction of a diode 202.

The metal oxides have any phase (e.g., crystalline and amorphous) or mixtures of multiple phases. The deposited metal oxides can have dopants (i.e., substitional defects) such as an aluminum atom where a hafnium atom should be, vacancies (missing atoms), and interstitials (extra atoms). Amorphous-phase metal oxides may have increased resistivity, which in some embodiments can lower the operational currents of the device to reduce potential damage to the memory element 102.

Figure 4:
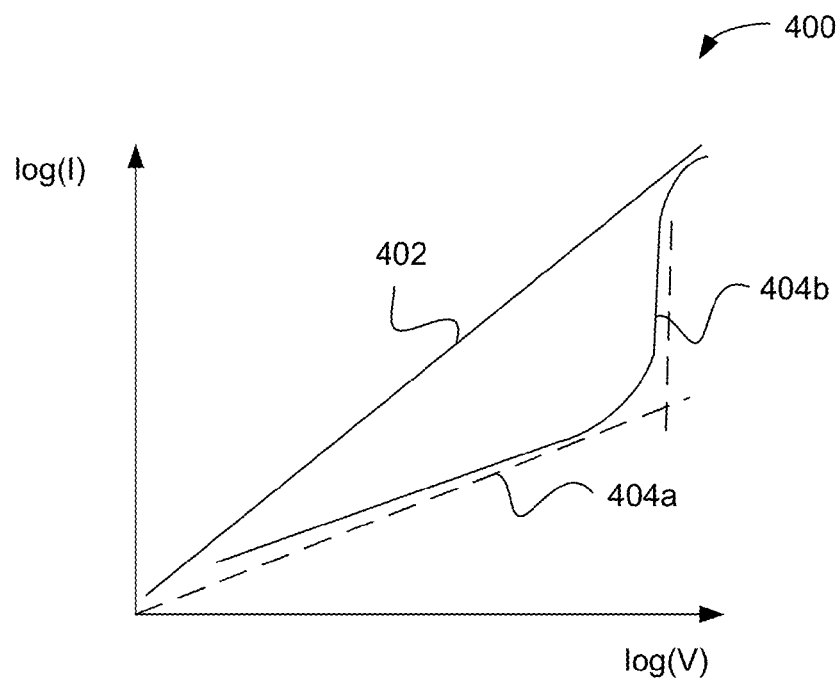
FIG. 4 is a current (I) versus voltage (V) plot for a memory element that demonstrates a resistance state change.

FIG. 4 is a current (I) versus voltage (V) plot 400 for a memory element 102 that demonstrates a resistance state change. The plot 400 shows a voltage ramp applied to the memory element 102 along the x-axis and the resulting current along a y-axis. The line 402 represents the response of an Ohmic material when the ramped voltage is applied. An Ohmic response is undesirable, since there is no discrete voltage at which the set or reset occurs.

Generally, a more abrupt response like graph 404 is desired. The graph 404 begins with an Ohmic response 404a, and then curves sharply upward 404b. The graph 404 may represent a set operation, where the memory element 102 switches from the HRS 302 to the LRS 304.

Without being bound by theory, non-metallic percolation paths are formed during a set operation and broken during a reset operation. For example, during a set operation, the memory element 102 switches to a low resistance state. The percolation paths that are formed by filling traps (which would otherwise impede carrier flow) increase the conductivity of the metal oxide, thereby reducing (i.e., changing) the resistivity. The voltage represented by 404b is the set voltage. At the set voltage, the traps are filled and there is a large jump in current as the resistivity of the metal oxide decreases. The application of a reset voltage empties the filled traps.

IV. Voltage-Dependent (Field-Based) Switching Characteristics

FIGS. 5 and 6 are graphs showing the relationship between thicknesses of a metal oxide layer and resulting set voltages, reset voltages, and on/off current ratios for several materials systems used in memory elements described herein. These graphs illustrate the characteristics of a memory element that includes two electrodes and a single layer of metal oxide disposed in between. As can be seen in FIG. 5, for memory elements including hafnium oxide 502, aluminum oxide 504, or tantalum oxide 506, set voltage increases with (i.e. is dependent on) thickness, and in some embodiments and for these materials the set voltage is at least one volt (V) per one hundred angstroms (Å) of the thickness of a metal oxide layer in the memory element. In some embodiments, an increase in the thickness of the metal oxide layer of 100 Å increases the set voltage by at least 1V. Similarly, as shown in FIG. 6, reset voltage for hafnium oxide 602, aluminum oxide 604, or tantalum oxide 606 also depends on thickness. These data therefore support a bulk-controlled set/reset mechanism for these materials, since a linear relationship indicates the formation of percolation paths throughout the bulk of the metal oxide. In other words, for a thicker material, more voltage is needed to fill the traps.

Hafnium oxide (5.7 electron volts (eV)), aluminum oxide (8.4 eV) and tantalum oxide (4.6 eV) all have a bandgap greater than 4 eV, while titanium oxide (3.0 eV) and niobium oxide (3.4 eV) have bandgaps less than 4 eV. Other higher bandgap metal oxides that can be used with various embodiments described herein include yttrium oxide and zirconium oxide. As shown in FIGS. 5 and 6, set voltages for titanium oxide 508 and niobium oxide 510 and reset voltages for titanium oxide 608 and niobium oxide 610 do not increase with thickness. Therefore, a higher bandgap (i.e., bandgap greater than 4 eV) metal oxide exhibits bulk mediated switching and scalable set and reset voltages.

As is also described above, the fact that the switching voltages are dependent on thickness indicates that these material systems (e.g. with a resistive-switching layer having a bandgap greater than 4 eV) have voltage-dependent electric field-based switching characteristics. In other words, during a set operation, the applied voltage allows the traps to be filled, and during the reset operation, the voltage empties the traps. For example, the thinner the layer, the fewer traps are present, and the less voltage is needed to fill or empty the traps. Because of the memory element 102's transient-type switching, the memory element 102 is able to switch using bipolar switching voltages even when only a single diode per memory element 102 is used as a select element because of the transient pulse voltage that the memory element 102 is briefly exposed to before the diode 202 blocks the current. In some embodiments described herein, it is believed that these transient-type switching characteristics may be voltage-dependent (electric field-based).

V. Use of Single Diode for Bipolar ReRAM

Figure 7:
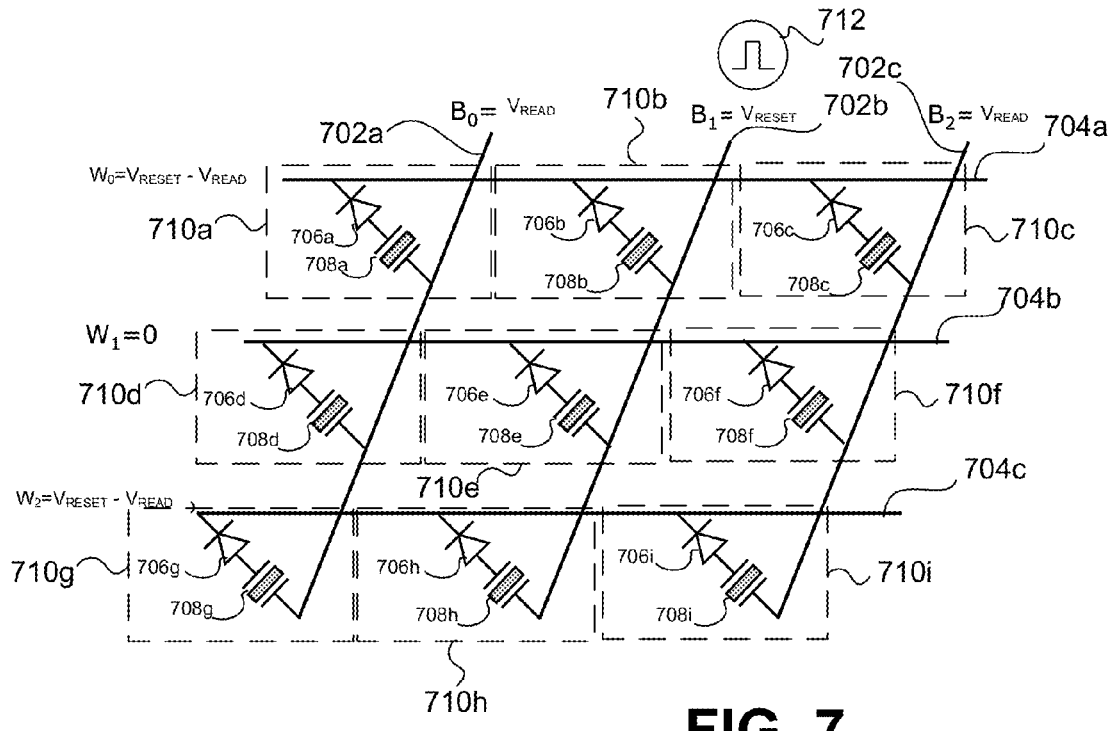
FIGS. 7 and 8 are circuit diagrams showing a memory array during a reset operation.
Figure 8:
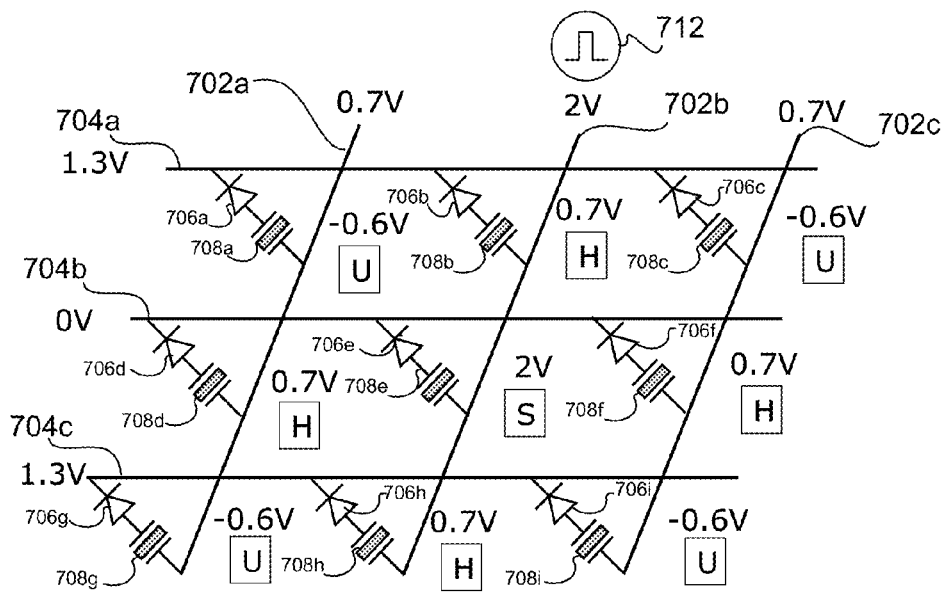
Figure 9:
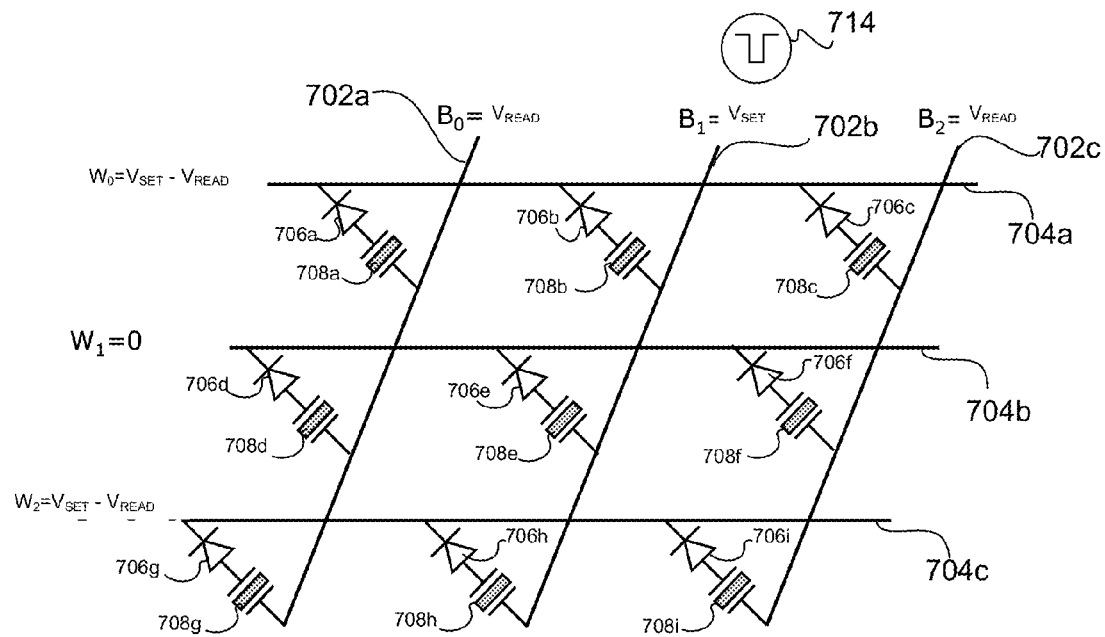
FIGS. 9 and 10 are circuit diagrams showing the memory array of FIGS. 7 and 8 during a set operation.
Figure 10:
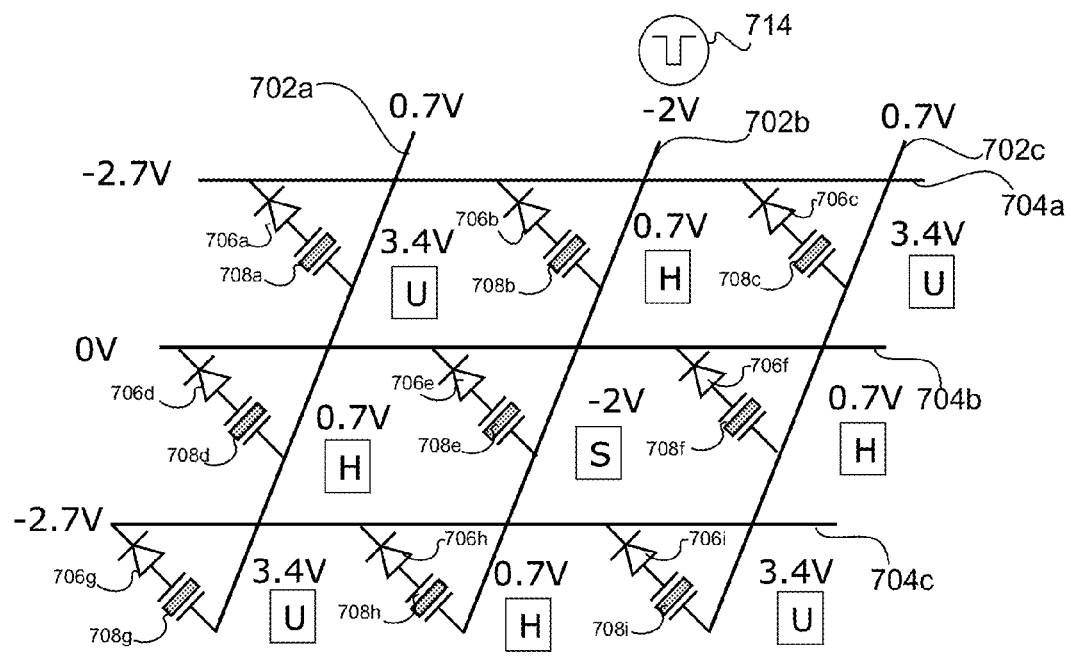
Figure 11:
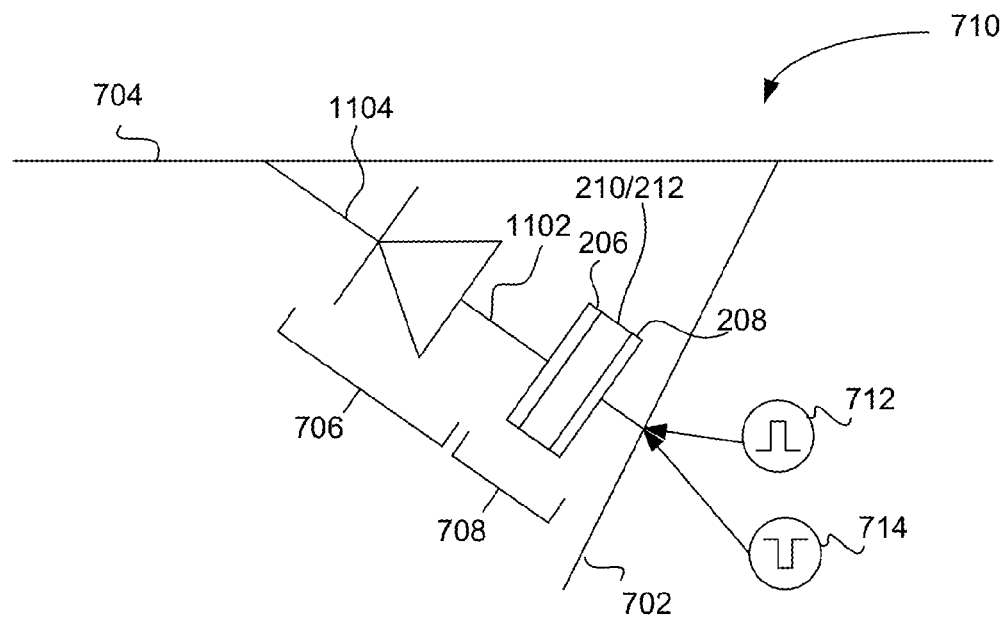
FIG. 11 illustrates a single memory cell of the memory array of FIGS. 7 and 8 in more detail.
Figure 12:
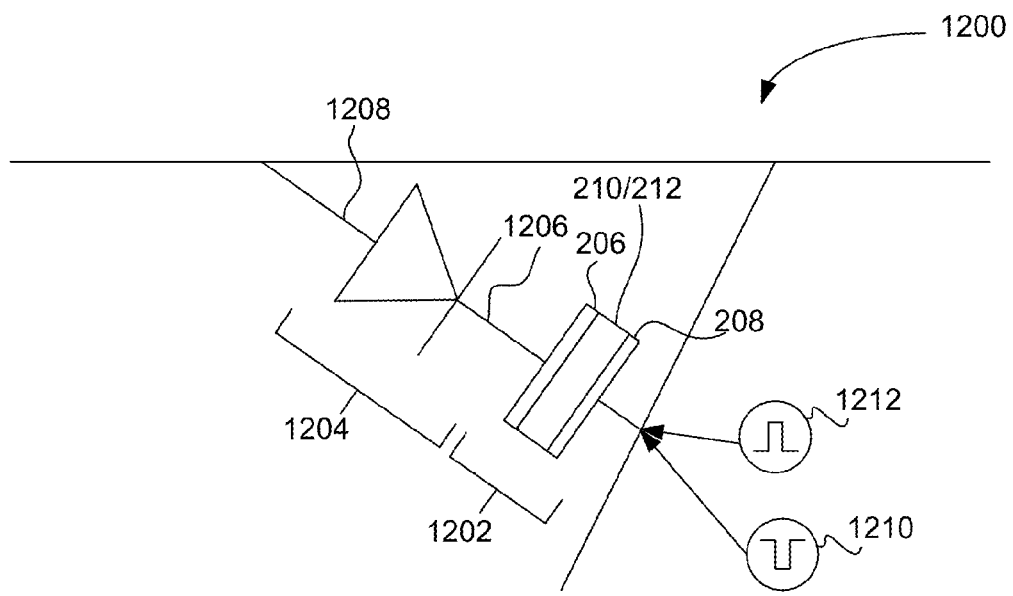
FIG. 12 shows an alternative memory cell for a materials system in which a reset voltage is negative at a higher work function electrode.

FIGS. 7-12 illustrate a memory array 100 that includes a bipolar-switching ReRAM memory element 102 and uses a select element that includes a single diode. FIGS. 7 and 8 are circuit diagrams showing the voltages applied to the memory array 100 during a reset operation, and FIGS. 9 and 10 are circuit diagrams showing the voltages applied to a memory array 100 during a set operation. FIG. 11 illustrates a single memory cell in more detail, while FIG. 12 illustrates another embodiment of a memory cell.

A. Reset Operation

FIG. 7 shows symbolic representations of voltages applied to bit lines 702 and word lines 704, and FIG. 8 shows numerical examples of voltages used to select a memory element for switching. The memory array 100, as shown here, includes nine memory elements 708a-708i (e.g. the stack 204) attached to nine diodes 706a-706i (e.g. the diode 202). The combination of each memory element 708 and diode 706 is a memory cell 710 (for example, the memory cell 710a includes the memory element 708a and the diode 706a). Memory cells 710 are shown only in FIG. 7 to maintain the clarity of the drawings.

As shown in FIG. 7, the center memory element 708e is to be selected for switching. The reset voltage for the memory element is applied at the bit line 702b ($B_1$) corresponding to the memory element 708e to be selected, and a ground is applied at the word line 704b ($W_1$) corresponding to the memory element 708e. The other bit lines 702a ($B_0$) and 702c ($B_2$) receive the read voltage $V_{READ}$, and the other word lines 704a ($W_0$) and 704c ($W_2$) receive voltage equal to $V_{RESET} - V_{READ}$. These voltages are applied to the bit lines (e.g. the bit lines 702a and 702c) and word lines (e.g. the word lines 704a and 704c) adjacent to the selected memory element 708e to avoid disturbing the memory states of memory cells adjacent to the selected memory element 708e.

FIG. 11 is a more detailed view of an individual memory cell 710 of the memory array 100. As is shown, the first electrode 206 of the memory element 708 is connected to an anode 1102 (e.g. the node 218) of the diode 706. The second electrode 208 is connected to a signal line, here the bit line 702, and a cathode 1104 (e.g. the node 220) of the diode 706 is connected to the word line 704. As shown in this example, during a reset operation, a positive voltage pulse (e.g. the pulse 712) can in some embodiments be applied to the higher work function electrode (e.g. the second electrode 208). For example, certain materials systems that may have a positive reset pulse at the second electrode 208 when using bipolar switching include those with a titanium nitride first electrode 206 and a platinum, ruthenium, ruthenium oxide, iridium, or iridium oxide, or other noble or near-noble materials second electrode 208. Because the voltage across the diode 706 is in the forward bias direction of the diode 706, the current flows through the diode 706, and the memory element 708 switches during the reset operation. In a set operation, a negative voltage pulse 714 can be applied to the second electrode 208.

In the numerical examples shown in FIG. 8, the reset voltage is +2V, and is applied at the bit line 702b ($B_1$). The reset voltage can be a transient voltage pulse 712, for example a square pulse having a pulse length of 10 µs or less, 5 µs or less, 500 ns or less, etc. The word line 704b ($W_1$) is held at ground, and the +2V is delivered across the memory element 708e. The result is that +2V is applied to the memory element 708e, and the memory element 708e switches (i.e. is selected, as indicated by the "S" surrounded by a box). The memory elements 702a, 702c, 702g, and 702i receive −0.6V and do not switch (or are "unselected" as indicated by the "U" surrounded by a box). The memory elements 702b, 702d, 702f, and 702h receive 0.7V, the read voltage, and are unlikely to switch (or are "half-selected" as indicated by the "H" surrounded by a box).

The other memory elements 708a-708d and 708f-708j generally will not switch. The bit line 702b of the memory element 708d to be selected has a reset voltage of +2V applied to them, and the adjacent bit lines 702a ($B_0$) and 702b ($B_2$) have a read voltage $V_{READ}$ of 0.7V applied to it. Here, $V_{READ}$ may be the minimum voltage to forward bias the diode 706 (e.g. +0.7V) so that when the memory elements are read, the read voltage is low enough that it does not switch the memory element. The word line 704b ($W_1$) that is attached to the memory element 708e to be selected is held at ground, while the other word lines 704a ($W_0$) and 704c ($W_2$) are held at the switching voltage minus the read voltage (e.g. $V_{RESET}-V_{READ}$, or +1.3V).

Of the remaining memory elements 708a-708d and 708f-708j, the memory elements 708a, 708c, 708g, and 708j receive −0.6V and are unselected (as indicated by the "U" surrounded by a box), meaning that they will not switch. The memory elements 708b, 708d, 708f, and 708h receive the read voltage (or +0.7V) and are half selected (as indicated by the "H" surrounded by a box), meaning that it is unlikely that they will switch.

B. Set Operation

FIGS. 9 and 10 illustrate the application of a set voltage to set the memory element 708e. FIG. 9 shows symbolic representations of voltages to be applied on the bit lines 702 and word lines 704. FIG. 10 shows numerical examples of voltages applied and the selection of the memory element 708e.

As with the reset operation, when the memory element is set, the bit lines 702a ($B_0$) and 702c ($B_2$) are held at $V_{READ}$ (e.g. +0.7V), while the word lines 704a ($W_0$) and 704c ($W_2$) are held at $V_{SET}-V_{READ}$ (e.g. −2.7V). The bit line 702b ($B_1$) which corresponds to the memory element 708e is held at the set voltage (e.g. −2V), and the word line 704b ($B_1$) which corresponds to the memory element 708e is held at ground. The set voltage can be a transient voltage pulse 714, for example a square pulse having a pulse length of 10 µs or less, 5 µs or less, 500 ns or less, etc.

As shown in FIG. 10, using the numerical examples of voltages, the memory element 708e receives the set voltage −2V and is selected (as indicated by the "S" surrounded by a box). The memory elements 708a, 708c, 708g, and 708i receive +3.4V and are unselected (as indicated by the "U" surrounded by a box) and are not going to switch. The memory elements 708b, 708d, 708f, and 708h receive the read voltage +0.7V, and are "half-selected" (as indicated by the "H" surrounded by a box) and are unlikely to switch.

FIG. 12 shows an alternative memory cell 1200 for a materials system in which a reset voltage is negative at a higher work function electrode. The memory cell 1200 is which is analogous to the memory cells 710, and can be substituted into the arrays shown in FIGS. 7-10. In the memory cell 1200, the MIM-style stack 1202 includes a first electrode 206, a second electrode 208, a switching layer 210 between the first electrode 206 and second electrode 208, and optionally an interface layer 212 between the switching layer and the second electrode 208. The first electrode 206 is connected to a cathode 1206 of a diode 1204. The diode 1204 can be the diode 202, for example, and in this example, the doped silicon layer 214 is an n-type layer and the doped silicon layer 216 is a p-type layer so that the diode 1204 is forward biased from the node 1208 to the node 1206.

The MIM-style stack 1202 may include a material system where the first electrode 206 is a doped silicon electrode (e.g. n-type polysilicon), the switching layer 210 includes a higher-bandgap material (e.g. $HfO_2$), and the second electrode 208 includes TiN or other material with a work function higher than the doped silicon electrode that is a non-noble material (e.g. TaN, MoN, MoOx, etc.). The TiN second electrode 208, in this example, has a higher work function than the n-type polysilicon of first electrode 206. The second electrode 208 has a work function that is greater than that of the first electrode 206, for example between 0.1 and 1.0 eV, or between 0.4 and 0.6 eV greater. Using this materials example, the reset voltage pulse 1210 can be negative relative to a common electrical reference, and the set pulse 1212 can be positive relative to a common electrical reference. The diode 1204 is therefore biased in the direction of the reset voltage pulse 1210 because the magnitude of $V_{RESET}$ is typically higher than the magnitude of $V_{SET}$.

As mentioned above, the diode 706e is not a Zener diode, and has a breakdown voltage that has a magnitude that higher than a magnitude of the set voltage. In some embodiments, the magnitude of the breakdown voltage ($V_{BREAKDOWN}$) is at least 2V, at least 4V, at least 6V, or at least 10V greater than the magnitude of the set voltage (e.g. if $V_{SET}$ is −2V, then $V_{BREAKDOWN}$ is at least −4V, at least −6V, at least −8V, or at least −10V). Therefore, since the breakdown voltage is greater (or much greater) than the set voltage, the set voltage is insufficient to reverse bias the diode 706e. Since the characteristics of the memory element 708e are such that the switching behavior of the memory element 708e depends on transient switching effects, the memory element 708e is able to switch during the brief period when a transient pulse voltage is seen by the memory element 708e before the diode 706e blocks the reverse-biased voltage.

Although the memory element 102 has been described in alternate embodiments using a positive reset voltage at the second electrode 208, and an anode of the diode 202 connected to the first electrode 206, or using a negative reset voltage at the second electrode 208 and a cathode of the diode 202 connected to the first electrode 206 it is understood that other configurations may be used. Generally, bipolar switching voltages are used (i.e. one switching voltage has a first polarity relative to a common electrical reference, and the other switching voltage has a second polarity relative to the common electrical reference, the first polarity is opposite the second polarity). A non-Zener, p-n junction diode is connected to one electrode of the memory element 102 and biased in either direction. The transient pulse voltage of a switching voltage that is applied in the reverse bias direction of the diode is sufficient to cause the memory elements 102 described herein to switch.

Although the foregoing examples have been described in some detail for purposes of clarity of understanding, the invention is not limited to the details provided. There are many alternative ways of implementing the invention. The disclosed examples are illustrative and not restrictive.

What is claimed is:
1. A resistive-switching memory element comprising:
a resistive-switching layer; and
a diode;
wherein the resistive-switching layer is configured to switch between a high resistive state and a low resistive state in response to a transient pulse of electrical current in a first direction;
wherein the diode is connected in series with the resistive-switching layer; and wherein the diode is configured to allow the electrical current to flow in the first direction through the resistive-switching layer during the transient pulse; and wherein the diode is further configured to prevent the electrical current from flowing in the first direction through the resistive-switching layer after the transient pulse.

2. The resistive-switching memory element of claim 1, wherein a duration of the transient pulse is less than 1 ms.

3. The resistive-switching memory element of claim 1, wherein a duration of the transient pulse is less than 10 µs.

4. The resistive-switching memory element of claim 1, wherein a duration of the transient pulse is less than 100 ns.

5. The resistive-switching memory element of claim 1, wherein a switching voltage applied to the resistive-switching memory element to switch the resistive-switching layer between the high resistive state and the low resistive state is less than a breakdown voltage of the diode.

6. The resistive-switching memory element of claim 5, wherein the breakdown voltage of the diode is at least 10V.

7. The resistive-switching memory element of claim 1, further comprising a first electrode between the resistive-switching layer and the diode.

8. The resistive-switching memory element of claim 7, wherein the first electrode comprises one of Pt, Ru, $RuO_2$, Ir, $IrO_2$, TiN, W, Ta, TaN, or doped silicon.

9. The resistive-switching memory element of claim 1, wherein the diode comprises a p-doped layer and an n-doped layer;
wherein the p-doped layer is connected to the resistive-switching layer; and
wherein the n-doped layer is connected to a signal line.

10. The resistive-switching memory element of claim 1, wherein the diode comprises a p-doped layer and an n-doped layer;
wherein the n-doped layer is connected to the resistive-switching layer; and
wherein the p-doped layer is connected to a signal line.

11. The resistive-switching memory element of claim 1, wherein the diode is a p-i-n diode.

12. The resistive-switching memory element of claim 1, wherein the resistive-switching layer is a bi-polar resistive-switching layer.

13. The resistive-switching memory element of claim 1, further comprising two signal lines;
wherein the resistive-switching layer and the diode are between the two signal lines.

14. The resistive-switching memory element of claim 1, wherein the resistive-switching layer comprises a material that has a leakage current density less than 40 A/cm² measured at 0.5 V per 20 Angstroms of a thickness when the resistive-switching layer is in its high resistive state.

15. The resistive-switching memory element of claim 1, wherein the resistive-switching layer comprises at least one of $HfO_2$, $Ta_2O_5$, or $Al_2O_3$, $Y_2O_3$, or $ZrO_2$.

16. The resistive-switching memory element of claim 1, wherein the diode is not a Zener diode.

17. The resistive-switching memory element of claim 1, further comprising an interface layer between the diode and the resistive-switching layer.

18. The resistive-switching memory element of claim 17, wherein the interface layer comprises one of titanium oxide, zirconium oxide, or aluminum.

19. The resistive-switching memory element of claim 17, wherein the interface layer is less than 10 Angstroms thick.

20. A resistive-switching memory element comprising:
a first signal line;
a resistive-switching layer;
an electrode;
a diode; and
a second signal line,
wherein the resistive-switching layer is configured to switch between a high resistive state and a low resistive state during a transient pulse while passing an electrical current through the resistive-switching memory element in a first direction during the transient pulse,
wherein the resistive-switching layer comprises one of $HfO_2$, $Ta_2O_5$, or $Al_2O_3$, $Y_2O_3$, or $ZrO_2$,
wherein the resistive-switching layer is between the first signal line and the electrode, wherein the electrode comprises at least one of Pt, Ru, $RuO_2$, Ir, $IrO_2$, TiN, W, Ta, TaN, or doped silicon;
wherein the diode is between the second signal line and the electrode;
wherein the diode is connected in series with the resistive-switching layer, and
wherein the diode is configured to block an electrical current through the resistive-switching memory element in the first direction after the transient pulse; and
wherein the diode is configured to allow an electrical current through the resistive-switching memory element in the first direction during the transient pulse.

* * * * *